US010193002B2

(12) United States Patent
Lin et al.

(10) Patent No.: US 10,193,002 B2
(45) Date of Patent: Jan. 29, 2019

(54) MOS VARACTORS AND METHODS FOR FABRICATING MOS VARACTORS

(71) Applicant: Globalfoundries Singapore Pte. Ltd., Singapore (SG)

(72) Inventors: Kemao Lin, Singapore (SG); Shaoqiang Zhang, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 102 days.

(21) Appl. No.: 15/263,590

(22) Filed: Sep. 13, 2016

(65) Prior Publication Data

US 2018/0076337 A1     Mar. 15, 2018

(51) Int. Cl.
| | | |
|---|---|---|
| *H01L 29/93* | (2006.01) | |
| *H01L 29/94* | (2006.01) | |
| *H01L 29/10* | (2006.01) | |
| *H01L 27/08* | (2006.01) | |

(52) U.S. Cl.
CPC .................................. *H01L 29/93* (2013.01)

(58) Field of Classification Search
CPC .................................................. H01L 29/1058
USPC ......................................................... 257/602
See application file for complete search history.

(56) References Cited

U.S. PATENT DOCUMENTS

| | | | |
|---|---|---|---|
| 2003/0052388 A1 | 3/2003 | Mheen et al. | |
| 2010/0244113 A1 | 9/2010 | Rieh et al. | |
| 2012/0187494 A1* | 7/2012 | Huang | H01L 29/93 257/368 |
| 2012/0281336 A1* | 11/2012 | Marino | H01G 7/00 361/281 |
| 2015/0255630 A1* | 9/2015 | Tesson | H01L 29/423 257/602 |

OTHER PUBLICATIONS

Oh et al., The Island-Gate Varactor_A High-Q MOS Varactor for Millimeter-Wave Applications, IEEE Microwave and Wireless Components Letters, Apr. 2009, pp. 215-217, vol. 19, No. 4.

* cited by examiner

*Primary Examiner* — Moazzam Hossain
*Assistant Examiner* — Omar Mojaddedi
(74) *Attorney, Agent, or Firm* — Lorenz & Kopf, LLP (57) ABSTRACT

A metal oxide semiconductor varactor includes an active area doped well that is disposed within a semiconductor substrate and a gate structure including a first portion that extends over the active area doped well and a second portion that extends over the semiconductor substrate outside of the active area doped well. The varactor further includes at least one active area contact structure formed in physical and electrical connection with the active area doped well, in a three-sided contact-landing area of the active area doped well. Still further, the varactor includes a gate contact structure that is formed in physical and electrical contact with the gate structure in the second portion of the gate structure such that the gate contact structure overlies the semiconductor substrate outside of the active area doped well.

6 Claims, 5 Drawing Sheets

MOS VARACTORS AND METHODS FOR FABRICATING MOS VARACTORS

TECHNICAL FIELD

The present disclosure generally relates to integrated circuits and methods for fabricating integrated circuits. More particularly, the present disclosure relates to integrated circuits that include a metal oxide semiconductor (MOS) varactor, and methods for fabricating integrated circuits that include a MOS varactor.

BACKGROUND

A varactor is a voltage-controlled capacitor, wherein the capacitance of the capacitor is directly related to the voltage applied to its terminals. MOS varactors, that is, a varactor implemented on a metal oxide semiconductor device, have particular application in radio frequency (RF) and millimeter wave (mmW) local oscillators, which in turn find application in radar and telecommunications technologies, among others. For example, the past several years have witnessed the rapidly expanding commercial application of the mmW band in 60 GHz wireless personal area networking (WPAN) systems and in 77 GHz automotive radar systems.

The phase noise of local oscillators, which influences the overall performance of the system in which they are implemented, is strongly dependent, especially in the 60 GHz and above frequency ranges, on the quality factor (Q-factor) of the MOS varactor in the local oscillator. The Q-factor of a MOS varactor can be expressed as:

$$Q = \frac{1}{\omega C R_s}$$

where $\omega$ is the frequency, $C$ is the capacitance, and $R_s$ is the series resistance (which itself has two components: gate resistance and channel resistance of the MOS varactor). As is apparent, as frequency increases, the Q-factor decreases. Thus, for applications such as those noted above where a higher frequency is required, it becomes necessary to reduce the series resistance in order to maintain a suitable Q-factor on par with MOS varactors that operate at lower frequencies.

Figure 1:
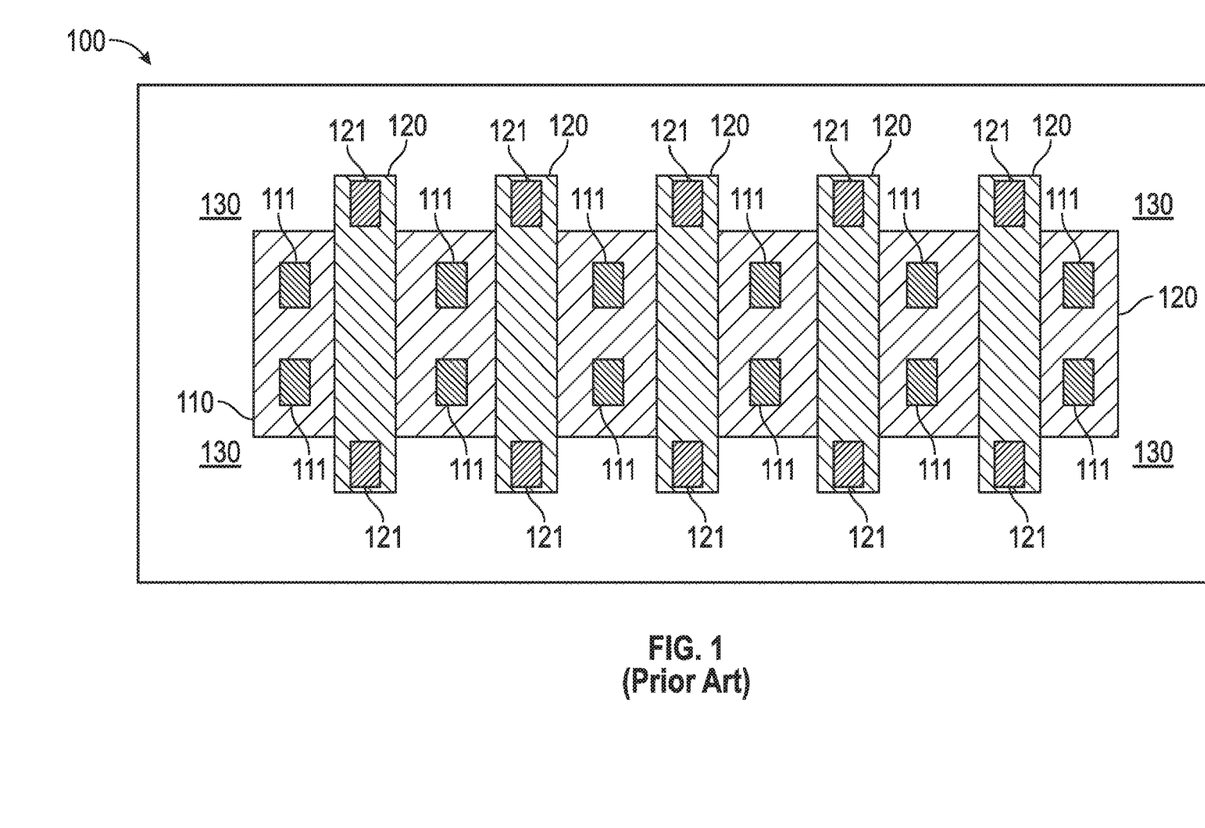
FIG. 1 illustrates a prior art, multi-finger MOS varactor structure.

The series resistance of a MOS varactor is highly dependent on the layout of the MOS varactor, that is, the dimensions of its gate and channel structures, as well as the positioning of its gate and channel structures with respect to one another. Thus, considerable effort has been expended in the past few years in order to find optimized MOS varactor layout designs that reduce the series resistance. An early example of this effort is the so-called "multi-finger" MOS varactor structure, which is depicted in FIG. 1. As shown, a multi-finger MOS varactor structure 100 is provided that includes an elongated, rectangular "active area" 110, which is typically embodied as an N-type well (N-well) disposed within a P-type semiconductor substrate (P-substrate) 130. The active area 110 includes a plurality of contact structures 111 connected therewith (typically heavily-doped N-type areas (N+ areas) are disposed in the N-well 110 at the location of each contact structure 111 to ensure adequate ohmic contact with the N-well 110). Disposed transversely across the elongated N-well is a plurality of elongated, rectangular gate structures 120. The gate structures 120 may be considered to resemble "fingers" stretched across the N-well 110, hence the common name multi-finger MOS varactor structure. Each gate structure 120 includes a plurality of gate contact structures 121. It should be noted that the gate contact structures 121 are disposed on the gate 120 so as not to overlie the active area N-well 110, but rather overlie the P-substrate 130 outside of the active area N-well 110. The reason for this placement of the gate contact structure 121 is to avoid the possibility of gate oxide damage to the gates 120 in the active area N-well 110 when forming the gate contact structure 121, as such gate oxide damage is known to cause device reliability problems.

Although the multi-finger layout design represents an improvement over conventional MOS varactor designs, the distance between the gate contact structures (i.e., the length of the gate through the active area N-well) remains undesirably high, which in turn causes an undesirably high gate resistance component of $R_s$, and thus a lower Q-factor of the MOS varactor. Other, more recent designs have attempted to reduce this length by providing "gate islands" within the active area N-well, such as the layout disclosed in FIGS. 1 and 2 of U.S. Patent Application Publication No. 2010/0244113 A1 to Rieh et al., but as noted above, due to the required placement of gate contacts overlying the active area N-well, this layout may suffer from reliability problems.

Accordingly, it would be desirable to provide MOS varactors with layout designs that lower the series resistance and increase the quality factor. It would also be desirable to provide MOS varactors with layout designs wherein the gate contact structures do not overlie the active area N-well to ensure device reliability. It would further be desirable to provide methods for fabricating such MOS varactors using conventional CMOS manufacturing processes and techniques. Furthermore, other desirable features and characteristics of the present disclosure will become apparent from the subsequent detailed description and the appended claims, taken in conjunction with the accompanying drawings and the foregoing technical field and background.

BRIEF SUMMARY

Metal oxide semiconductor (MOS) varactors are disclosed. In one exemplary embodiment, a MOS varactor includes an active area doped well that is disposed within a semiconductor substrate and a gate structure that includes a first portion that extends over the active area doped well and a second portion that extends over the semiconductor substrate outside of the active area doped well. The gate structure includes a proximal end in the first portion, a distal end in the second portion, and lateral sides that extend between the proximal and distal ends. The active area doped well extends adjacent to the lateral sides and adjacent to the proximal end so as to form a three-sided contact-landing area of the active area doped well. The MOS varactor further includes at least one active area contact structure formed in physical and electrical connection with the active area doped well. The at least one active area contact structure is formed within the three-sided contact-landing area. Still further, the MOS varactor includes a gate contact structure that is formed in physical and electrical contact with the gate structure in the second portion of the gate structure such that the gate contact structure overlies the semiconductor substrate outside of the active area doped well.

In another exemplary embodiment, a MOS varactor includes a first active area doped well that is disposed within a semiconductor substrate and a second active area doped well that is disposed within the semiconductor substrate, the first and second active area doped wells being spaced apart from one another with respect to a surface of the semiconductor substrate. The MOS varactor further includes an extended gate structure including a first end portion that extends over the first active area doped well, a second end portion that extends over the second active area doped well, and an intermediate portion that extends over the semiconductor substrate between the first and second active area doped wells, outside of both of the first and second active area doped wells. The extended gate structure includes a proximal end in the second portion, a distal end in the first portion, and lateral sides that extend between the proximal and distal ends. The MOS varactor further includes a plurality of active area contact structures formed in physical and electrical connection with the each of the first and second active area doped wells. Still further, the MOS varactor includes a gate contact structure that is formed in physical and electrical contact with the extended gate structure in the intermediate portion of the extended gate structure such that the gate contact structure overlies the semiconductor substrate between the first and second active area doped wells and outside of both of the first and second active area doped wells.

In yet another exemplary embodiment, a method for fabricating a MOS varactor includes providing or obtaining a semiconductor substrate, forming an active area doped well within the semiconductor substrate, and forming a gate structure including a first portion that extends over the active area doped well and a second portion that extends over the semiconductor substrate outside of the active area doped well. The gate structure includes a proximal end in the first portion, a distal end in the second portion, and lateral sides that extend between the proximal and distal ends. The active area doped well extends adjacent to the lateral sides and adjacent to the proximal end so as to form a three-sided contact-landing area of the active area doped well. The method further includes forming at least one active area contact structure formed in physical and electrical connection with the active area doped well. The at least one active area contact structure is formed within the three-sided contact-landing area. Still further, the method includes forming a gate contact structure in physical and electrical contact with the gate structure in the second portion of the gate structure such that the gate contact structure overlies the semiconductor substrate outside of the active area doped well.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the disclosed MOS varactors or the application and uses of such MOS varactors. Furthermore, there is no intention to be bound by any expressed or implied theory presented in the preceding technical field, background, brief summary or the following detailed description.

Embodiments of the present disclosure are generally directed to MOS varactors implemented as a part of an integrated circuit (IC), and methods for fabricating such integrated circuits. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based varactors are well-known and so, in the interest of brevity, many conventional steps will only be mentioned briefly herein or will be omitted entirely without providing the well-known process details.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

While "MOS" originally referred to metal-oxide-semiconductor transistors, as used herein MOS varactors designate all types of insulated-gate devices, whether or not such devices include metal gates, as the term "MOS" is commonly applied in the industry. For example, MOS varactors include those varactors utilizing silicon gate technologies that use doped polysilicon gates and silicided gates.

Figure 2:
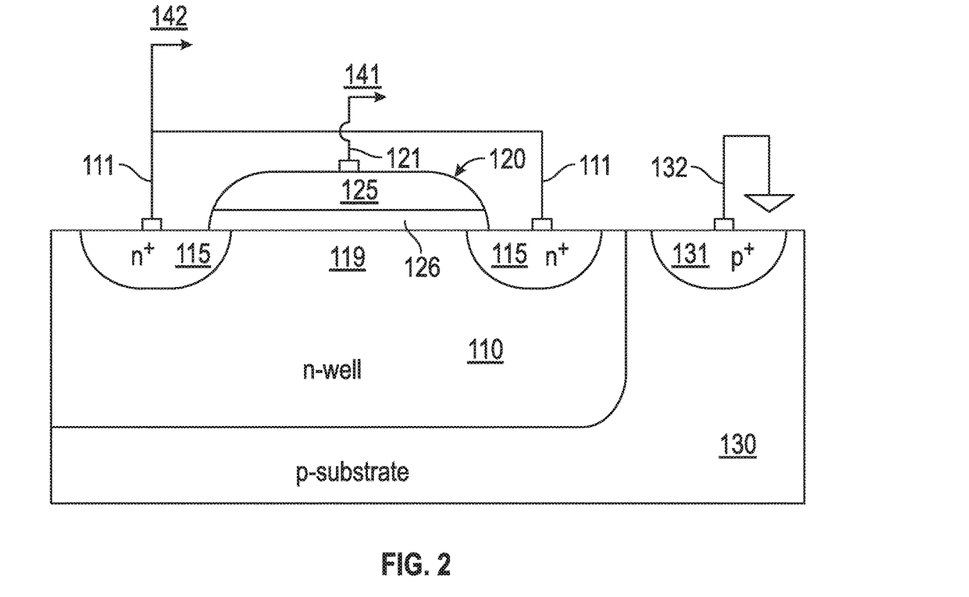
FIG. 2 illustrates, in cross-section, a MOS varactor structure common to the various embodiments of the present disclosure.

Although the present disclosure focuses on improved layout designs of MOS varactors (i.e., the relative placement and configuration of the active area N-well, the gate structures, and the contacts to the N-well and the gate structures)

to improve their Q-factor, for purposes of completeness of disclosure, FIG. 2 illustrates an exemplary MOS varactor 150 in cross-section. As the cross-sectional drawing does not provide a two-dimensional impression of the layout design (that is, as viewed from above the semiconductor surface, akin to FIG. 1) of the MOS varactor 150, MOS varactor 150 may be considered common to or representative of a cross-section of MOS varactors of subsequent FIGS. 3 and 4, which illustrate exemplary MOS varactors by their layout design. As shown in FIG. 2, MOS varactor 150 generally includes a semiconductor substrate 130, which in some embodiments may be a P-type semiconductor substrate. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 130 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

In some embodiments, the semiconductor substrate 130 may be provided with a substrate contact or "body" contact structure 132. The body contact structure 132 is a conductive element that makes physical and electrical contact with the P-type substrate via a heavily P-type doped area 131 (P+ area) to ensure adequate ohmic contact between the body contact structure 132 and the P-type substrate 130. As used herein, "heavily" refers to doped layers having more than one dopant atom per one-hundred thousand atoms of semiconductor (such as silicon).

Within the P-type semiconductor substrate 130 is disposed an active area N-well 110, which may be configured and sized in accordance with the exemplary layout designs shown in FIGS. 3 and 4, as will be described in greater detail below. The active area N-well 110 may be provided with a plurality of active area contact structures 111, which again may be configured in accordance with the below-described exemplary layout designs. The active area contact structures 111 are conductive elements that make physical and electrical contact with the active area N-well 110 via heavily N-type doped areas 115 (N+ areas) to ensure ohmic contact between the active area N-well 110 and the contact structures 111.

As further shown in FIG. 2, a gate structure 120 overlies the active area N-well 110, in part, and in part extends (into the page) beyond the bounds of the active area N-well 110 and over the P-substrate 130. The size and configuration of the gate structure 120, including the portions of which extend over the active area N-well 110 and the portions of which extend over the P-substrate 130 (outside of the active area N-well 110), are described in greater detail below in accordance with the exemplary layout designs of FIGS. 3 and 4. The gate structure 120 may include a conductive gate element 125 and a gate insulator layer 126. The conductive gate element 125 may be an electrically conductive metal material, or, as noted above, it may be a conductive doped silicon material, such as heavily N-type doped silicon. The gate insulator layer 126 may be an electrically insulative material, such as a metal oxide or a silicon oxide (or combination of two or more layers thereof). The area underneath the gate structure 120, within the active area N-well 110 and between the active area contact structures 111, may be considered to be a "channel" region 119 of the MOS varactor; although, in contrast to a MOS transistor, current does not flow through the channel region 119, but rather charge accumulates therein in the manner of a capacitor. The gate structure 120 may be provided with a gate contact structure 121, which is a conductive element that provides physical and electrical connection to the gate structure 120. As noted above, the gate contact structure 121 is preferably located so as to overlie the P-substrate 130 outside of the active area N-well 110, to ensure device reliability (i.e., contact structure 121 is located "into the page" with respect to contact structure 111).

Although not shown, overlying the P-substrate 130 and the gate structure 120 may be one or more electrically insulating layers, commonly referred to as interlayer dielectrics (ILD). Exemplary ILD materials include silicon oxides and silicon nitrides. Over each ILD layer may be one or more conductive metallization layers, which electrically connect with the various contact structures 111, 121. For example, in an embodiment, the gate contact structures 121 may be wired through a first metallization layer 141 (e.g., M1) and the active area N-well contact structures 111 may be wired through a second, overlying metallization layer 142 (e.g., M2). The contact structures 111, 121 may be formed so as to pass through a respective ILD.

Figure 3:
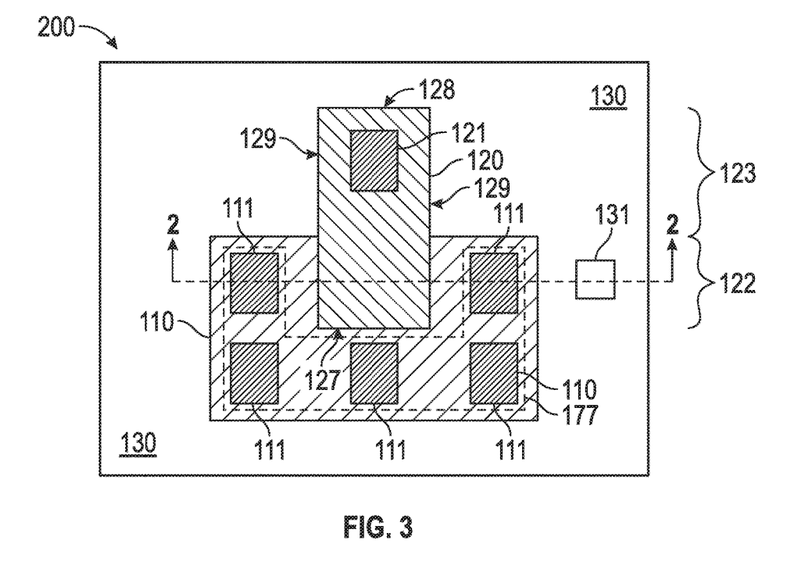
FIG. 3 illustrates a MOS varactor layout design in accordance with some embodiments of the present disclosure.
Figure 4:
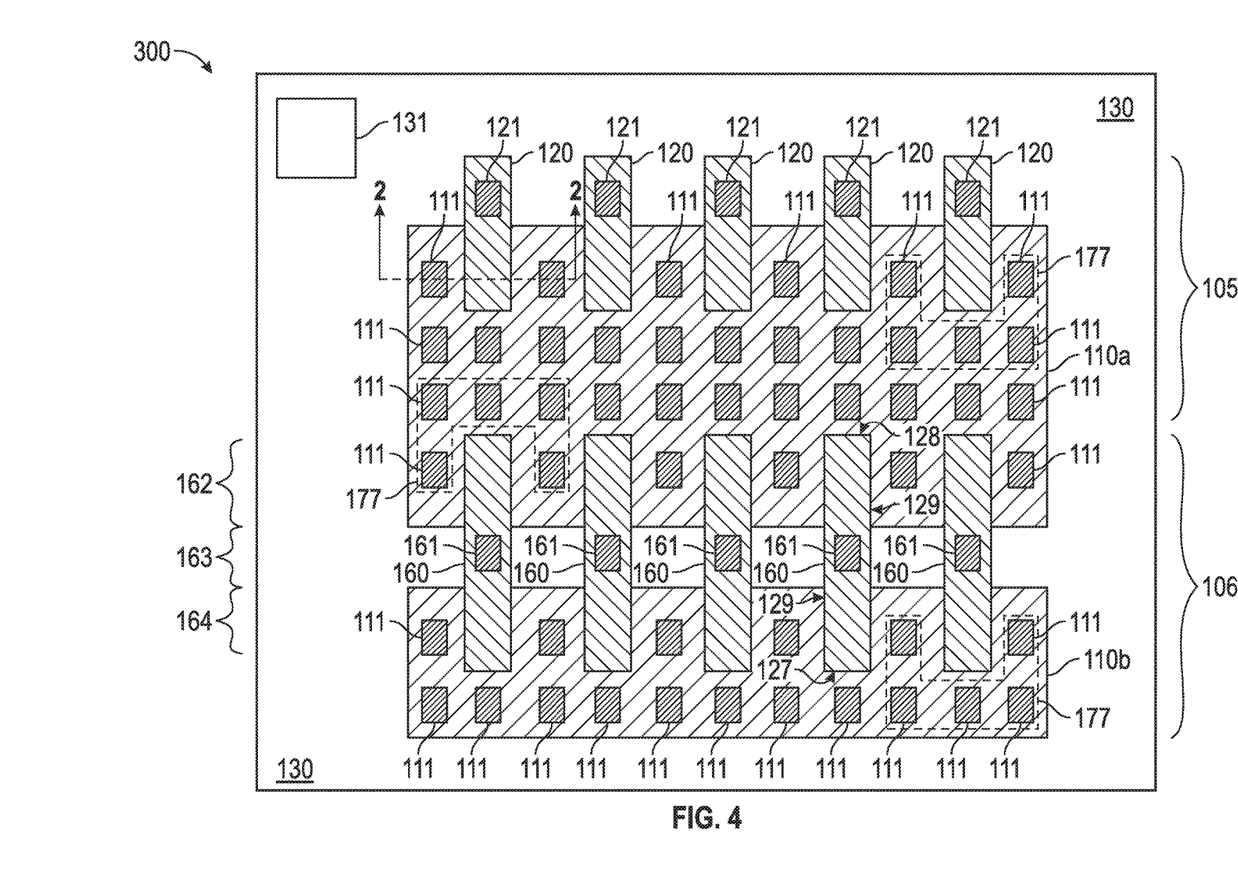
FIG. 4 illustrates a MOS varactor layout design in accordance with further embodiments of the present disclosure.
Figure 5A:
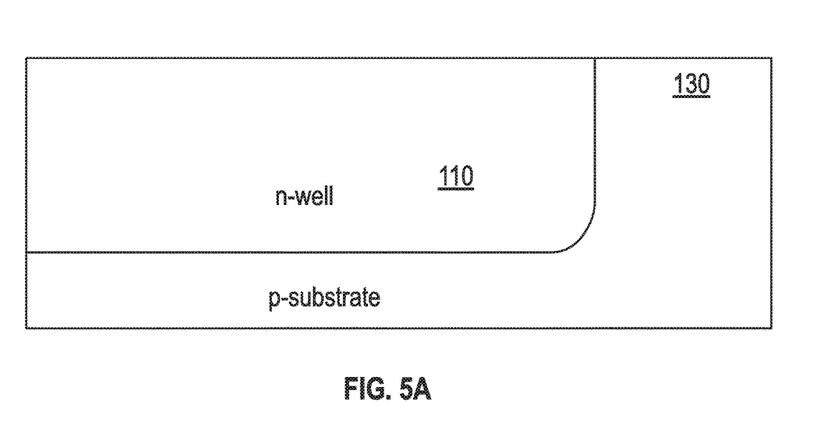
FIGS. 5A-B and 6A-B illustrate methods for fabricating MOS varactors in accordance with the exemplary embodiment layout designs.
Figure 5B:
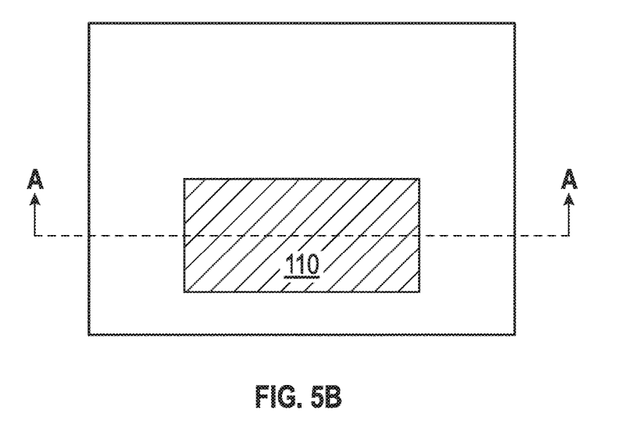

Turning now to FIGS. 3 and 4, exemplary MOS varactor layout designs are provided as top-down views looking onto the P-substrate 130. Thus, although the vertical cross-section of the various illustrated elements is not explicitly illustrated, reference may be made to previously-described FIG. 2, which provides such a cross-section that may be considered to be common to both FIGS. 3 and 4 in all relevant aspects, as indicated by arrows 2-2. Beginning with FIG. 3, an exemplary MOS varactor 200 includes an active area doped well 110, such as an N-well, disposed within a semiconductor substrate 130, such as a P-substrate. The active area N-well 110 may be embodied substantially as a rectangle as shown in FIG. 3, or alternatively is may be a square shape, a circle shape, an irregular polygon, or any other suitable shape as may be desirable for a given IC implementation. The MOS varactor 200 further includes a gate structure 120 that extends partially over the active area N-well 110, and partially over the P-substrate 130 outside of the active area N-well 110. That is, a first portion 122 of gate structure 120 extends over the active area N-well 110, and a second portion 123 of the gate structure 120 extends over the P-substrate 130 outside of the active area N-well. The gate structure 120 is configured so as to include a proximal end 127, a distal end 128, and lateral sides 129 that extend between the proximal and distal ends 127, 128. The proximal end is disposed over the active area N-well 110, and the distal end is disposed over the P-substrate 130 outside of the active area N-well 110. The active area N-well extends adjacent to the lateral sides 129 and adjacent to the proximal end 127 so as to form a three-sided contact-landing area 177 of the active area N-well 110. The active area N-well includes at least one, but sometimes a plurality of contact structures 111 formed in physical and electrical connection therewith, possibly within the three-sided contact-landing area 177. At least a first and second of the contact structures 111 are formed adjacent to the lateral sides 129 of the gate structure 120 (one adjacent to each side), and at least a third of the contact structures 111 is formed adjacent to the proximal end 127 of the gate structure 120 (i.e., longitudinally aligned therewith). In this manner, at least three of the plurality of contact structures 111 are formed adjacent to the gate structure 120, thus resulting in reduced channel resistance, reduced series resistance, and improved Q-factor. The channel resistance is reduced because current has more pathways to travel. Although not illustrated in FIG. 3 or 4, it will be appreciated, as described in connection with FIG. 2, that the active area contact structures may be formed in electrical and physical connection with heavily-doped N-type areas of the N-well 110. The MOS varactor 200 further includes a gate contact structure 121, which is formed in physical and electrical connection with the gate structure in a portion thereof that overlies the P-substrate 130 outside of the active area N-well 110, for example adjacent to the distal end 128 of the gate structure.

Turning now to FIG. 4, another exemplary embodiment of a MOS varactor 300 is illustrated. As shown in FIG. 4, the P-substrate 130 includes a first active area N-well 110*a* and a second active area N-well 110*b*. In a first region 105 of the MOS varactor 300, a structure substantially similar to that shown in FIG. 3 is formed with regard to the configuration and placement of gate structures 120, gate contact structures 121, and active area contact structures 111, and thus the MOS varactor elements present in first region 105 need to be reiterated herein. However, in this embodiment, the MOS varactor 300 includes a second region 106 that encompasses portions of the first active area N-well 110*a* and an entirety of a second active area N-well 110*b*. The first and second active area N-wells 110*a*. 110*b* are spaced apart from one another with respect to the surface of the P-substrate 130. The second region 106 includes extended gate structures 160 that have three portions: a first end portion 162 that is disposed over the first active area N-well 110*a*, a second end portion 164 that is disposed over the second active area N-well 110*b*, and an intermediate portion 163, between the first and second end portions 162, 164 that is disposed over the P-substrate 130 between the first and second active area N-wells 110*a*, 110*b* and outside of both of the first and second active area N-wells 110*a*, 110*b*. A gate contact structure 161 is provided in physical and electrical contact with the extended gate structure 160, with the gate contact structure being disposed in the intermediate portion 163 of the extended gate structure 160, that is, over the P-substrate 130 outside of both of the first and second active area N-wells 110*a*, 110*b*. Furthermore, in this embodiment, at least three active area contact structures 111 are provided adjacent to each of the first and second end portions 162, 164 of each extended gate structure 160, in a manner similar to that described above with regard to FIG. 3. That is, in each active area N-well 110*a*, 110*b* at least two active area contact structures 111 are provided on opposite lateral sides 129 of the extended gate structure 160, and at least one active area contact structure is provided adjacent to each of the proximal and distal ends 127, 128 in the second and first active area N-wells 110*b*, 110*a*, respectively. More explicitly, in embodiments at least a first and a second of the active area contact structures 111 are formed adjacent to opposite lateral sides 129 of the extended gate structure 160 in the first end portion 162, at least a third of the active area contact structures 111 is formed adjacent to the distal end 128 of the extended gate structure 160 in the first end portion 162, at least a fourth and a fifth of the active area contact structures 111 are formed adjacent to opposite lateral sides 129 of the extended gate structure 160 in the second end portion 164, and at least a sixth of the active area contact structures 111 is formed adjacent to the proximal 127 end of the extended gate structure in the second end portion 164 (i.e., longitudinally aligned therewith). In this manner, with a single gate contact structure 161 sharing two channel areas of a single extended gate structure 160 (one in each of the first and second active area N-wells 110*a*, 110*b*, with which such extended gate structure 160 is in contact), the gate resistance component of the series resistance ($R_s$) may additionally be reduced (in addition to the reduced channel resistance as described above with regard to FIG. 3), resulting in an even further reduced $R_s$, and an even further increased Q-factor.

An exemplary method for fabricating a MOS varactor in accordance with the forgoing exemplary layout design is provided in FIGS. 5A-B and 6A-B, wherein the "A" Figures provide a cross-sectional view (similar to FIG. 2), and the "B" Figures provide an overhead view (similar to FIGS. 3-4). Beginning with FIGS. 5A-B, the exemplary method includes providing (or otherwise obtaining) a semiconductor substrate 130, such as a P-substrate. The exemplary method then includes forming a doped well 110, such as an N-well, within the P-substrate 130. The step of forming the N-well may be accomplished on the basis of well-known ion implantation techniques, wherein portions of the P-substrate 130 that are not intended to be doped are masked with a suitable masking material, such as a photoresist material, and the unmasked portions are bombarded with high-speed ion species of the appropriate doping type.

Figure 6A:
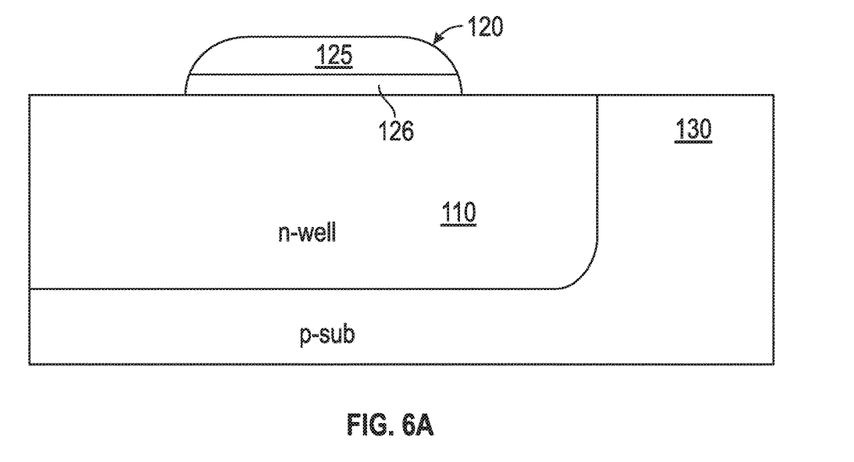
Figure 6B:
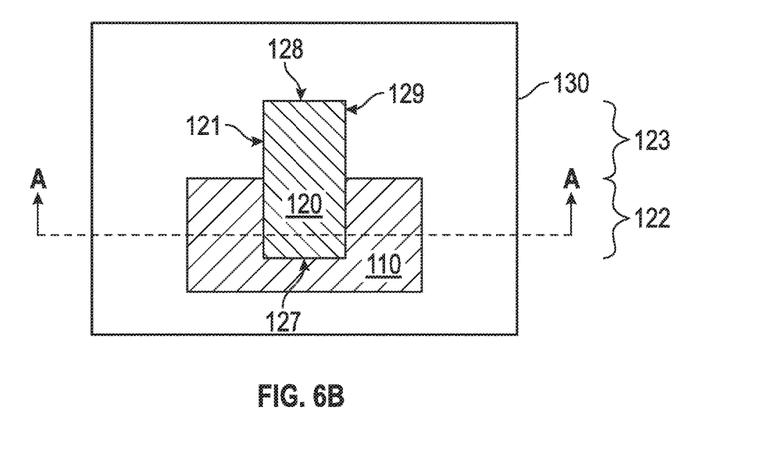

Continuing now with FIGS. 6A-6B, the exemplary method continues with forming a gate structure 120, wherein the gate structure 120 is formed such that a first portion 122 thereof is formed over the N-well 110, and a second portion 123 thereof is formed over the P-substrate 130 outside of the N-well 110. The gate structure 120 is also formed having a proximal end 127, a distal end 128, and lateral sides 129 that extend between the proximal and distal ends 127, 128. The proximal end extends over the active area N-well 110, and the distal end extends over the P-substrate 130 outside of the active area N-well 110. The gate structure 120 may be formed by depositing a layer of a gate insulator material 126, such a silicon or metal oxide, followed by a conductive gate material 125, such as metal or doped silicon, over the P-substrate 130. Photolithographic processes are then employed to shape the gate structure 120 in accordance with the above-described configuration. Such photolithographic processes conventionally employ depositing a photoresist material, patterning the photoresist material by exposure to appropriate light source, etching the exposed areas in the patterned photoresist layer, and subsequently removing any remaining photoresist material. Although not explicitly illustrated, sidewall spacers, for example including silicon oxide or silicon nitride, may be formed along sidewalls of the gate structure 120.

The method concludes as illustrated and previously described in FIGS. 2-3, with the formation of contact structures 111, 121 (and accompanying ILD layers) to the N-well 110 and the gate structure 120, respectively. As described above, at least a first and second of the contact structures 111 are formed adjacent to the lateral sides 129 of the gate structure 120 (one adjacent to each side), and at least a third of the contact structures 111 is formed adjacent to the proximal end 127 of the gate structure 120 (i.e., longitudinally aligned therewith). Further, the gate contact structure 121 is formed over the gate structure 120 in a portion thereof that overlies the P-substrate 130 outside of the active area N-well 110, for example adjacent to the distal end 128 of the gate structure. Further ion implantation processes may be performed, prior to the formation of the contact structures 111, 121 for purposes of forming the heavily-doped areas 115. For fabrication of these structures, an insulator material, such as silicon oxide, is conventionally blanket deposited as the ILD, followed by the etching of the ILD to form vias using conventional photolithographic processes as described above (i.e., over the heavily-doped areas 115 or over the gate outside of the N-well 110), followed by deposition of a suitable conductive metal for the contact structures, such as tungsten, copper, aluminum, or the like.

While not specifically illustrated, the method may include any additional steps as are convention in CMOS fabrication processes. For example, the method may include back-end-of-line (BEOL) processing steps such as metallization layer interconnection, and electrical pad formation to connect the IC with other devices. As such, any conventional, non-recited steps should not be understood as excluded in any respect from the present exemplary fabrication method.

Accordingly, this disclosure has provided MOS varactors and methods for fabricating MOS varactors that exhibit improved layout designs as compared to the prior art for purposes of increasing Q-factor at high frequencies, while maintaining good reliability. The disclosed MOS varactor do so by decreasing the channel resistance with at least three active area contact structures adjacent to the channel, decreasing the gate resistance by placing one gate contact structure for two channels, and by positioning the gate contact structures over the P-substrate and outside of any active area N-wells.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A metal oxide semiconductor (MOS) varactor comprising:
a first active area doped well that is disposed within a semiconductor substrate and a second active area doped well that is disposed within the semiconductor substrate, the first and second active area doped wells being spaced apart from one another with respect to a surface of the semiconductor substrate;
an extended gate structure comprising a first end portion that extends over the first active area doped well, a second end portion that extends over the second active area doped well, and an intermediate portion that extends over the semiconductor substrate between the first and second active area doped wells, outside of both of the first and second active area doped wells, wherein the extended gate structure terminates proximally at a proximal end of the extended gate structure that is within the second active area doped well, wherein the extended gate structure terminates distally at a distal end of the extended gate structure that is within the first active area doped well, and wherein the extended gate structure comprises lateral sides that extend between the proximal and distal ends;
a plurality of active area contact structures formed in physical and electrical connection with the each of the first and second active area doped wells, wherein at least a first and a second contract structure of the plurality of active area contact structures are formed adjacent to opposite lateral sides of the extended gate structure at the first end portion, and at least a third contact structure of the plurality of active area contact structures is formed distally adjacent to the distal end of the extended gate structure at the first end portion; and
a gate contact structure that is formed in physical and electrical contact with the extended gate structure in the intermediate portion of the extended gate structure such that the gate contact structure overlies the semiconductor substrate between the first and second active area doped wells and outside of both of the first and second active area doped wells.

2. The MOS varactor of claim 1, wherein at least a fourth and a fifth contact structure of the plurality of active area contact structures are formed adjacent to opposite lateral sides of the extended gate structure at the second end portion, and at least a sixth contact structure of the plurality of active area contact structures is formed proximally adjacent to the proximal end of the extended gate structure at the second end portion.

3. The MOS varactor of claim 1, wherein the first active area doped well comprises an N-well, wherein the semiconductor substrate comprises a P-substrate, and wherein the N-well comprises a plurality of heavily-doped N-type areas, the active area contacts being formed to the heavily-doped N-type areas.

4. The MOS varactor of claim 3, wherein the first through third contact structures of the plurality of active area contact structures are formed within a first three-sided contact-landing area that surrounds the first end portion of the extended gate structure, and wherein the fourth through sixth contact structure of the plurality of active area contact structures are formed within a second three-sided contact-landing area that surrounds the second end portion of the extended gate structure.

5. The MOS varactor of claim 4, further comprising a further gate structure formed partially over the first active area doped well partially over the semiconductor substrate outside of the first active area doped well, and partially over the second active area doped well.

6. The MOS varactor of claim 5, further comprising a further gate contact structure formed over the further gate structure and over the semiconductor substrate outside of the first and second active area doped wells.

* * * * *